United States Patent
Natarajan et al.

(10) Patent No.: US 8,178,261 B2
(45) Date of Patent: *May 15, 2012

(54) OPTICAL DATA STORAGE MEDIA AND METHODS FOR USING THE SAME

(75) Inventors: Arunkumar Natarajan, Niskayuna, NY (US); Patrick Joseph McCloskey, Watervliet, NY (US); Eugene Pauling Boden, Scotia, NY (US); Kwok Pong Chan, Troy, NY (US); Matthew Jeremiah Misner, Delanson, NY (US); Evgenia Mikhailovna Kim, Ballston Lake, NY (US); Victor Petrovich Ostroverkhov, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/967,409

(22) Filed: Dec. 14, 2010

(65) Prior Publication Data

US 2011/0081602 A1 Apr. 7, 2011

Related U.S. Application Data

(63) Continuation-in-part of application No. 12/550,521, filed on Aug. 31, 2009.

(51) Int. Cl.
*G03H 1/02* (2006.01)

(52) U.S. Cl. ........... 430/1; 430/2; 430/280.1; 359/3
(58) Field of Classification Search .............. None
See application file for complete search history.

(56) References Cited

U.S. PATENT DOCUMENTS

| | | | |
|---|---|---|---|
| 4,877,717 A | 10/1989 | Suzuki et al. | |
| 5,223,356 A * | 6/1993 | Kumar et al. | 430/1 |
| 5,459,174 A | 10/1995 | Merrill et al. | |
| 7,459,263 B2 | 12/2008 | Farid et al. | |
| 2004/0175656 A1 | 9/2004 | Baer et al. | |
| 2007/0147214 A1* | 6/2007 | Erben et al. | 369/103 |
| 2008/0144146 A1* | 6/2008 | Boden et al. | 359/3 |
| 2010/0302927 A1* | 12/2010 | Natarajan et al. | 369/103 |
| 2011/0051586 A1* | 3/2011 | Natarajan et al. | 369/103 |
| 2011/0053054 A1* | 3/2011 | Natarajan et al. | 430/2 |
| 2011/0053055 A1* | 3/2011 | Natarajan et al. | 430/2 |

* cited by examiner

*Primary Examiner* — Martin Angebranndt
(74) *Attorney, Agent, or Firm* — Andrew J. Caruso

(57) ABSTRACT

An optical data storage medium is provided. The optical data storage medium includes a polymer matrix; a reactant capable of undergoing a change upon triplet excitation, thereby causing a refractive index change; and a non-linear sensitizer capable of absorbing actinic radiation to cause upper triplet energy transfer to said reactant. The refractive index change capacity of the medium is at least about 0.1. The reactant comprises polyvinyl chlorocinnamate, polyvinyl methoxycinnamate, or a combination thereof.

20 Claims, 3 Drawing Sheets

OPTICAL DATA STORAGE MEDIA AND METHODS FOR USING THE SAME

CROSS-REFERENCE TO RELATED APPLICATIONS

This application claims priority to non-provisional application Ser. No. 12/550,521 filed on Aug. 31, 2009, the entire contents of which are hereby incorporated by reference.

BACKGROUND

The present disclosure relates to optical data storage media. More particularly the present disclosure relates to holographic storage media as well as methods of making and using the same.

The rapid growth of information technology industry has led to an increasing demand for data storage systems. Optical data storage, wherein reading or writing of data is accomplished by shining light on, for example a disc, provides advantages over data recorded in media which must be read by other means, for example a magnetically sensitive head for reading magnetic media, or a needle for reading media recorded in vinyl. And, more data can be stored in smaller media optically than can be stored in vinyl media. Further, since contact is not required to read the data, optical media are not as vulnerable to deterioration over periods of repeated use as vinyl media.

Nonetheless, conventional optical data storage media does have limitations as known to one skilled in the art. Alternative data storage methods include holographic storage. This is an optical data storage method in which the data is represented as holograms. Early attempts at holographic storage relied on a page-based approach, i.e., where the bits of digital information are encoded into volume holograms as two-dimensional arrays of logical zeros and ones that traversed a 'slice' of the necessarily linear media onto which the holograms were recorded. More recent research into holographic data storage has focused on a bit-wise approach, where each bit (or few bits) of information is represented by a hologram localized to a microscopic volume within a medium to create a region that reflects the readout light. Materials capable of accommodating a bit-wise data storage approach are highly sought after as the equipment utilized to read and write to such material is either currently commercially available, or readily provided with modifications to readily commercially available reading and writing equipment. Further, holographic data storage by the bit-wise approach is more robust to temperature, wavelength, intensity variations, and vibration than holographic data stored using the page-based approach. In order to be optimally useful in the recordation of holograms, and in particular, micro-holograms, bit-wise data storage materials must be non-linear and further exhibit desirable refractive index change in response to recording light. The magnitude of the refractive index modulations produced in the material by the recording light defines the diffraction efficiency for a given system configuration, which translates to the signal to noise ratio, bit error rate, and the achievable data density.

Thus, there remains a need for optical data storage media that can exhibit a nonlinear (or "threshold") response to the recording light intensity and that is suitable for bit-wise holographic data storage. In particular, it would be advantageous for holograms stored in the media to be limited in depth so that increased capacity could be realized. It would be further desirable for such data storage media to be written in such a way that refractive index of the surrounding media is not significantly altered and that a substantial degradation of hologram efficiency at various depths is not seen. Desirably, any such materials provided would have sufficient refractive index change to support diffraction efficiencies so as to be capable of recording high-density micro-holographic data, thereby further expanding the storage capacity of the material.

BRIEF DESCRIPTION

In one embodiment an optical data storage medium is provided. The optical data storage medium includes a polymer matrix; a reactant capable of undergoing a change upon triplet excitation, thereby causing a refractive index change; and a non-linear sensitizer capable of absorbing actinic radiation to cause upper triplet energy transfer to said reactant. The refractive index change capacity of the medium is at least about 0.1. The reactant comprises polyvinyl chlorocinnamate (PVClCm), polyvinyl methoxycinnamate (PVMeOCm), or a combination thereof.

In another embodiment, a method for optical data storage is provided. The method comprises providing an optical data storage medium. The optical data storage medium includes a polymer matrix; a reactant capable of undergoing a change upon triplet excitation, thereby causing a refractive index change; and a non-linear sensitizer capable of absorbing actinic radiation to cause upper triplet energy transfer to said reactant. The refractive index change capacity of the medium is at least about 0.1. The reactant comprises polyvinyl chlorocinnamate, polyvinyl methoxycinnamate, or a combination thereof. A microhologram is recorded in said optical data storage medium.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
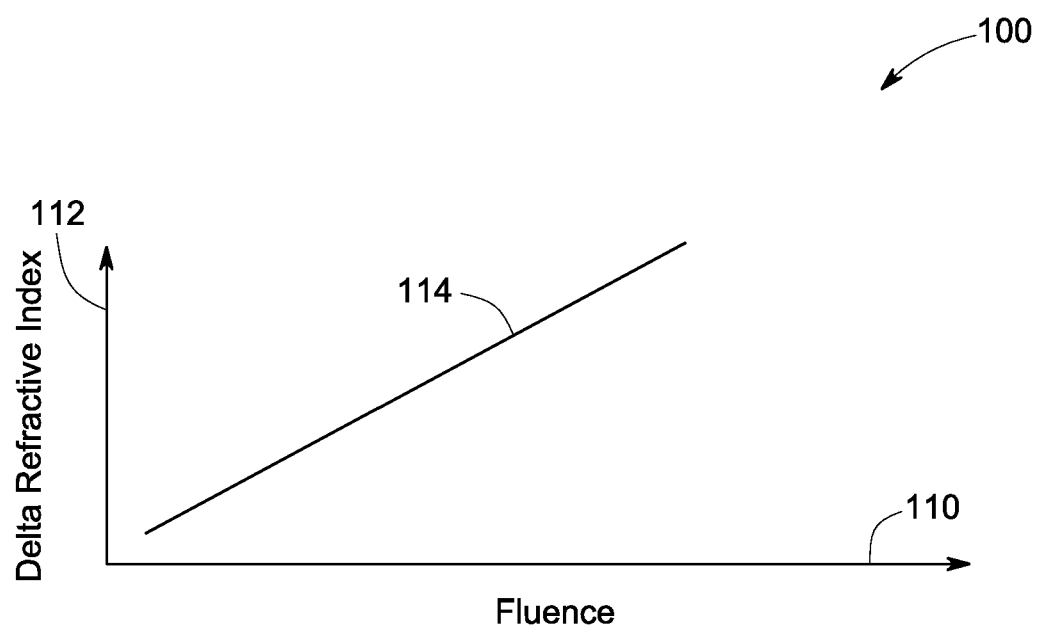
FIG. 1 is a graphical depiction of the response of a linear sensitizer to actinic radiation.

Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Similarly, "free" may be used in combination with a term, and may include an insubstantial number, or trace amounts, while still being considered free of the modified term.

As used herein, the terms "may" and "may be" indicate a possibility of an occurrence within a set of circumstances; a possession of a specified property, characteristic or function. These terms may also qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," and "the," are intended to mean that there are one or more of the elements. The terms "comprising," "including," and "having" are intended to be inclusive, and mean that there may be additional elements other than the listed elements. Furthermore, the terms "first," "second," and the like, herein do not denote any order, quantity, or importance, but rather are used to distinguish one element from another.

Embodiments of the invention described herein address the noted shortcomings of the state of the art. These embodiments advantageously provide an improved optical data storage medium. In one embodiment, an optical data storage medium is provided. The optical data storage medium includes a polymer matrix; a reactant capable of undergoing a change upon triplet excitation, thereby causing a refractive index change; and a non-linear sensitizer capable of absorbing actinic radiation to cause upper triplet energy transfer to said reactant. The refractive index change capacity of the medium is at least about 0.1. The reactant comprises polyvinyl chlorocinnamate (PVClCm), polyvinyl methoxycinnamate (PVMeOCm), or a combination thereof. Diffraction efficiency of the order greater that about 1 percent at numerical aperture (NA) of 0.4 is achievable using a relatively lower laser fluence of about 190 Joules per centimeter than what is typically used in the art, such as, a laser fluence of about 300 Joules per centimeter. This may be attributed to two reasons a) increased index change capacity at the wavelength of interest (405 nanometers), for example index change capacity of polyvinyl 4-methoxycinnamate is 0.18 vs. that of polyvinyl cinnamate (PVCm) which is 0.08; and (b) pre-alignment of the cinnamate pairs due to charge transfer donor-acceptor type of complex as described herein can give rise to increased sensitivity of the material to the laser fluence. Moreover the sensitivity of the optical storage medium is of the order of about $10^{-4}$ square centimeters per Joule as obtained from quantum efficiency data compared to the PVCm, which is in the order of $10^{-5}$.

As used herein, "diffraction efficiency" means a fraction of the beam power reflected by a hologram as measured at the hologram location with respect to the incident probe beam power, while "quantum efficiency" means a probability of an absorbed photon to result in a chemical change that produces a refractive index change. "Fluence" means the amount of optical beam energy that has traversed a unit area of the beam cross-section (measured, for example, in Joule per square centimeter), while "intensity" means optical radiative flux density, for example amount of energy traversing a unit area of beam cross-section in unit time (measured in, for example, Watt per square centimeter).

As used herein, the term "non-linear sensitizer" refers to a material that has a sensitivity having a dependence to the light intensity, i.e., the sensitivity has to be high enough at the high (recording) intensity, and low enough at the lower (readout) intensity. For example, in a situation where the read intensity is about 20 to about 50 times lower than the write intensity, the sensitivity (based on a specific assumptions on the readout life time and/or number of readout cycles the material has to survive) may decrease by an order greater than about $10^4$ times to about $10^5$ times the initial sensitivity. This difference in the intensity and sensitivity constitutes the amount of non-linearity the material has to exhibit.

There is provided herein optical data storage media suitable for recording microholographic data in a bit-wise approach. The media desirably exhibits a nonlinear response to actinic radiation, i.e., experiences no substantial change in refractive index for incident laser light below a threshold, and significant changes in refractive index above the threshold. Advantageously, recording into such a medium is only possible with the light having a power, or intensity, exceeding a threshold value and the recorded data can be repeatedly and substantially non-destructively read with light having intensity below the threshold. Microholograms recorded in the present optical data storage media are expected to be smaller in size than the beam used to record them.

In one embodiment, the optical data storage medium comprises a non-linear sensitizer and a reactant dispersed within a polymer matrix and can exhibit refractive index change suitable for the recordation of microholograms at high data densities. In one embodiment, the refractive index change capacity of the medium is at least about 0.1. In one embodiment, the refractive index change capacity is in a range of from about 0.1 to about 0.25. In yet another embodiment, the refractive index change capacity is in a range of from about 0.11 to about 0.2. In still yet another embodiment, the refractive index change capacity is in a range of from about 0.12 to about 0.18.

Although other properties can also impact the ability of an optical data storage media to record microholographic data in a bit-wise fashion, such as recording speed, recording intensity, and transparency to name a few, it is believed that the achievable diffraction efficiency and/or refractive index change of a particular media will be controlling the ability of the media to record microholographic data in a bit-wise fashion. Because of the diffraction efficiencies achievable by the present optical data storage media, the media may be capable of storing about 1 terabyte of information on a disk comparable in size to a single CD or single DVD.

In one embodiment, the present media comprises reactants capable of undergoing a change upon triplet excitation ($T_n$; n>1). As used herein, the term "change" is meant to include any indirect photochemical reaction of the reactant, for example photodimerization or isomerization. Photodimerization is a bimolecular photochemical process involving an electronically excited unsaturated molecule that undergoes addition with an unexcited molecule of a structurally similar and/or identical species (e.g. two olefins combining to form a cyclobutane ring structure). The covalent bonding that occurs in this reaction produces a new moiety which can be generally classified as a photoproduct. When the word "indirect" is used in conjunction with terms such as photodimerization, photochemical reaction or photoreaction, it means that the reactant did not receive the energy directly from absorption of a photon, but rather from another molecule (such as, for example, a sensitizer or mediator) that first absorbed the photon and then transferred a portion of that energy to the reactant that subsequently underwent dimerization.

In certain embodiments, the reactants suitable for use in the optical data storage media described may include the following properties and functionalities. In one embodiment, the reactants may be capable of undergoing dimerization so that less volume change is required to go from reactant to product, for example, reactants that undergo dimerization processes not by direct photoexcitation of the reactant but by indirect "non-radiative energy transfer" (in the present case triplet-to-triplet energy transfer) pathway from the photoexcited sensitizer to the reactant. The reactants wherein a nonlinear sensitizer receives energy from a two-photon process and delivers that energy to one reactant that subsequently condenses with a second reactant to provide a product. The reactants that, when derivatized on a polymer backbone can provide a very large refractive index change, which corresponds to the available capacity of the material, for example, a refractive index change capacity of at least about 0.1 may be achieved if greater that about 85 percent of the reactants are converted to product. Finally, those that, when derivatized on a polymer backbone, are capable of undergoing both inter- and intramolecular condensation reactions, thereby accelerating the consumption thereof. The reactants may be capable of providing desired refractive index changes with incident fluence of less than 10 joules per square centimeter as a result of higher quantum efficiency of the sensitized photo-reaction, which in turn may also provide greater diffraction efficiencies and shorter recording times.

As used herein, the term "sensitivity" is defined as the amount of index change obtained with respect to the amount of fluence used to irradiate a spot of the film with the laser light. If we know the fluence (F°) value and the amount of index change we can estimate sensitivity of the energy transfer (ET) process using the formula:

$$ET = dn(\text{maximum})/F°$$

wherein dn(maximum) is the maximum capacity index change material.

In one embodiment, the linear sensitizer capable of absorbing actinic radiation may include cinnamate materials. In one embodiment, the cinnamate materials may be capable of undergoing [2+2] indirect photodimerization and indirect photopolymerization may be used. These cinnamate materials, due to their transparency (negligible ultraviolet absorption) at about 405 nanometers or at about 532 nanometers keep the linear bleaching of the cinnamate to a minimum and facilitate only the triplet-triplet energy transfer from the excited sensitizer. In one embodiment, the cinnamate materials includes polyvinyl chlorocinnamate (PVClCm), polyvinyl methoxycinnamate (PVMeOCm), or a combination thereof. In one embodiment, the cinnamate content of the polyvinyl backbone is in a range of from about 54 weight percent to about 75 weight percent based upon the total weight of the polyvinylcinnamate. Suitable examples of polyvinyl chorocinnamate include polyvinyl 4-chlorocinnamate, polyvinyl 3-chlorocinnamate, and 2-chlorocinnamate. Suitable examples of polyvinyl methoxycinnamate include polyvinyl 4-methoxycinnamate, polyvinyl 3-methoxycinnamate, and polyvinyl 2-methoxycinnamate.

As used herein, the phrase "polyvinyl chlorocinnamate (PVClCm), polyvinyl methoxycinnamate (PVMeOCm), or a combination thereof" includes PVCm derivatives consisting of PVClCm, PVMeOCm, a physical blend of PVClCm and PVMeOCm, and a polyvinyl cinnamate derivative wherein the polyvinyl backbone consists of both chlorocinnamate and methoxycinnamate groups. The PVCm derivatives may be represented by using the formula I:

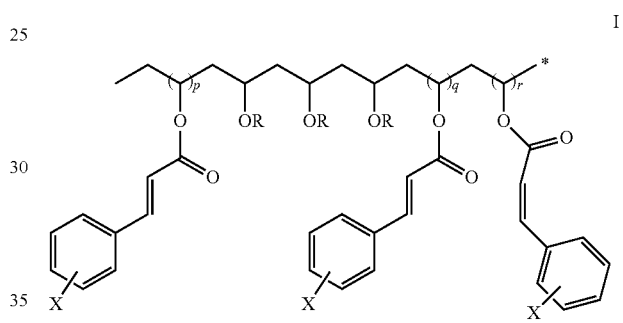

I wherein "R" is H or cinnamate; and "X" is chloro or methoxy. In one embodiment, the value of "p", "q", and "r" is such that the polymer has a molecular weight of about 100000. One skilled in the art will appreciate that a polymer having an appropriate molecular weight may be prepared by adjusting the quantities of the various reactants employed.

It is well known in the literature that the quantum efficiency of cinnamate dimerization can be improved by preordering the adjacent cinnamate molecules prior to [2+2] photodimerization with the help of electron donor and electron acceptor groups substitution on the cinnamate molecules [Pure and Appl. Chem., 1992, Vol. 64, 1299-1303 and *Macromolecules*, 1991, 24 (16), 4600-4604]. The reaction schematic shown below represents the electron donating and elector accepting capacities of the PVCm derivatives disclosed herein.

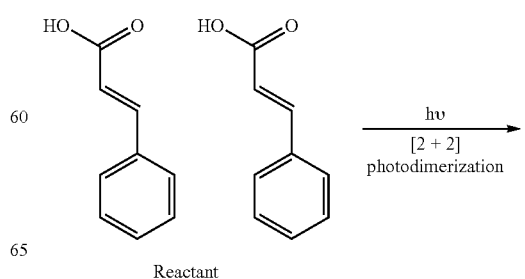

Reactant

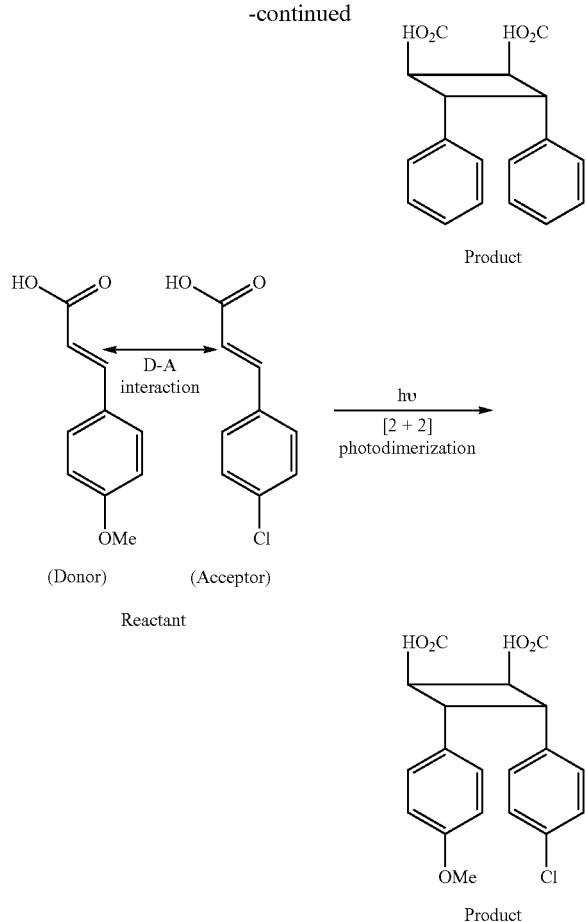

Reactant

Product

Figure 4:
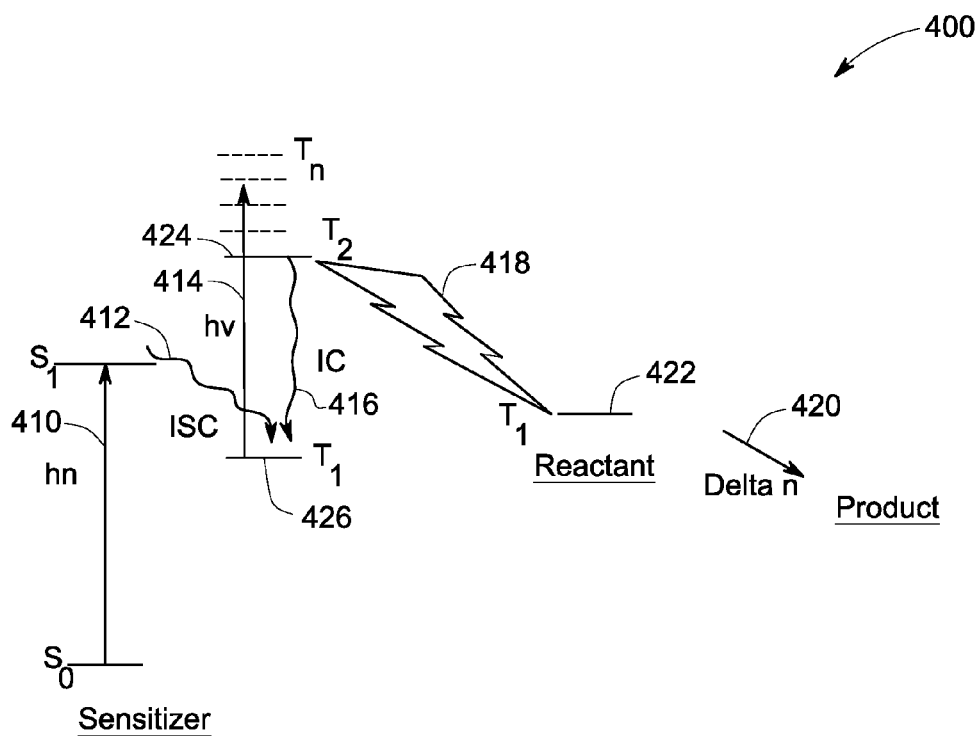
FIG. 4 is a schematic energy level diagram showing the upper triplet $T_n$ excited state absorption and resulting energy transfer for a sensitizer exhibiting reverse saturable absorption.

In one embodiment, the reactant(s) utilized in the present optical data storage media are capable of undergoing a change upon triplet excitation. Referring to FIG. 4, a schematic energy level diagram 400 is provided. The diagram 400 shows the upper triplet $T_n$ excited state absorption and resulting energy transfer for a sensitizer exhibiting reverse saturable absorption. The reactants used in the present optical data storage media have a triplet energy denoted by arrow 422 below that of the $T_2$ state of the sensitizer denoted by arrow 424, but above that of the $T_1$ state of the sensitizer, shown at arrow 426. The reactants are also capable of receiving energy from an upper triplet state ($T_2$ or higher) of the sensitizer, and undergoing a reaction to form a product, which provides a refractive index change within the polymer matrix and thus, a recorded hologram.

In addition to the aforementioned benefits, the use of such materials as the reactant in the optical data storage media described herein may also provide the possibility of a higher loading when derivatized on a polymer backbone than conventional reactants. For example, loading of conventional reactants when derivatized on a polymer backbone may be limited to about 30 mole percent. In certain embodiments, reactants described herein may be loaded onto polymer backbones at much greater loadings, i.e., up to about 90 mole percent when derivatized onto a polymer backbone.

In certain embodiments, the use of the reactants provided herein provide a significant decrease in birefringence as compared to conventional reactants. In certain other embodiments, the optical recording media described provides the ability to rapidly create high-resolution micro-holograms with minimal heat formation and signal leakage to neighboring locations that can result in smearing of the captured holographic pattern.

The reactant is usually present in relatively high concentrations both to yield large changes in optical properties within the polymer matrix and to promote efficient triplet energy transfer. In one embodiment, the reactant may be present in the optical data storage media in amounts in a range from about 2 mole percent to about 90 mole percent, based upon the total weight of the optical data storage media. In another embodiment, the reactant may be present in the optical data storage media in amounts in a range from about 5 mole percent to about 85 mole percent, based upon the total weight of the optical data storage media. In yet another embodiment, the reactant may be present in the optical data storage media in amounts in a range from about 10 mole percent to about 80 mole percent, based upon the total weight of the optical data storage media.

The reactant may be covalently attached, or otherwise associated with, the polymer matrix. For example, polymers functionalized with chlorocinnamates and methoxycinnamates may be utilized as the polymer matrix. In this case, In one embodiment, the optical data storage media may comprise higher loading amounts of the reactants, for example, up to about 90 weight percent, based upon the total weight of the optical data storage media.

In addition to the reactants described above, the present optical data storage media comprises one or more non-linear sensitizers. The non-linear sensitizers are capable of absorbing incident actinic radiation, for example in the form of one or more photons, and then transferring the energy to the reactant molecule to induce a molecular rearrangement of the reactant into a product that, in turn, gives rise to modulations in the refractive index of the medium. This modulation records both the intensity and phase information from the incident actinic radiation as the hologram. The advantages of the use of nonlinear (or "threshold") sensitizers as opposed to linear sensitizers can be further understood with references to FIGS. 1, 2, and 3.

Figure 2:
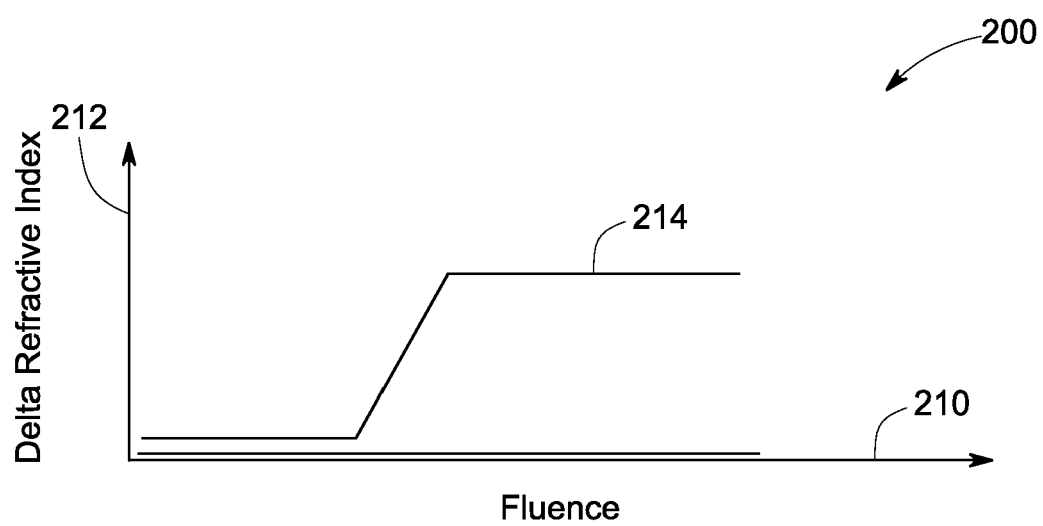
FIG. 2 is a graphical depiction of the response of a threshold sensitizer to actinic radiation.

Referring to FIG. 1 a graphical depiction 100 of the response of a linear sensitizer to actinic radiation is shown. The graph 100 includes a X-axis 110 representing fluence in joules per square centimeter and a Y-axis 112 representing change in refractive index. The curve 114 shows the response (maximum refractive index change) of a linear photosensitive material to incident actinic radiation. Referring to FIG. 2 a graphical depiction 100 of the response of a threshold material to actinic radiation is shown. The graph 200 includes a X-axis 210 representing fluence in joules per square centimeter and a Y-axis 212 representing change in refractive index. The curve 214 shows the response (maximum refractive index change) of a linear photosensitive material to incident actinic radiation. The continuously ascending curve 114 in FIG. 1 illustrates that the linear photosensitive materials will cause a reaction at any power density (intensity) of recording light and the amount of the refractive index change (delta N) achieved will be the same for the same radiative energy (fluence) received by the material. In contrast, the curve 214 for threshold materials illustrated that the threshold material will only cause a reaction at and over a certain light intensity of recording light.

Figure 3:
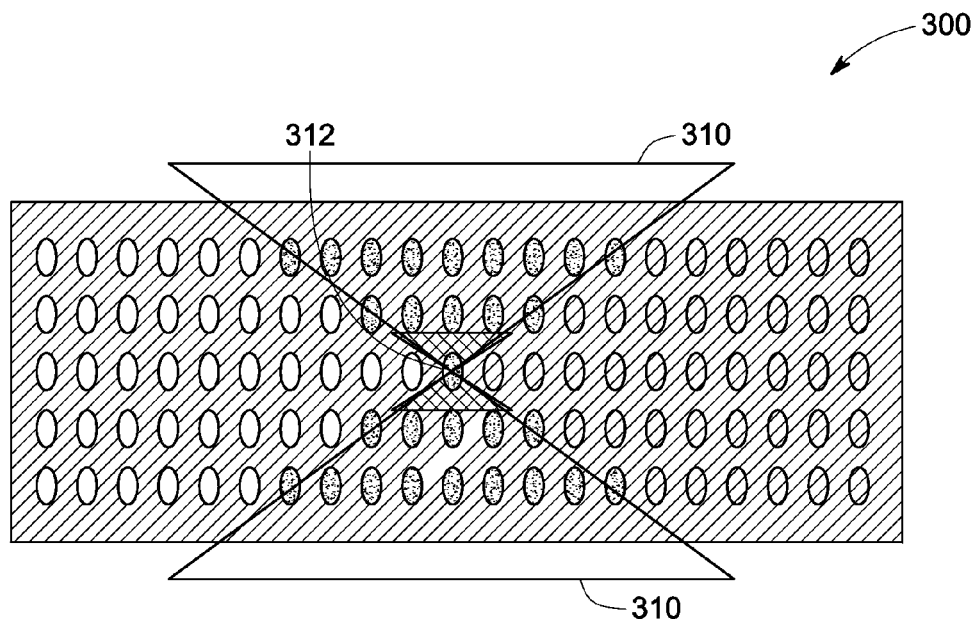
FIG. 3 is a cross-sectional view of an optical storage media, showing the area of impact of actinic radiation if the media comprises a linear sensitizer and the area of impact of actinic radiation if the media comprises a threshold sensitizer.

As a result, and as is shown in FIG. 3, in optical data storage media 300 comprising linear photosensitive materials, consumption of dynamic range will occur in non-addressed volumes, substantially everywhere actinic radiation passes through, shown as sections 310. In contrast, if data storage media 300 comprises threshold materials, consumption of dynamic range in non-addressed volumes is reduced or eliminated and consumption will occur substantially only in the target volume, i.e., at the focal point 312 of the actinic radiation. The use of threshold materials in the present optical data storage medium thus facilitates recording into a layer of bit-wise data buried in the bulk of the medium without disruption of adjacent layers of previously recorded data or vacant space available for subsequent recording. Also, as the light intensity in a tightly focused laser beam varies dramatically through the depth of the focal spot and is usually at its maximum at the beam waist (narrowest cross section), the threshold response of the medium will naturally restrict material conversion to occur only in the immediate vicinity of the beam waist. This may lead to a reduction in microhologram size within each layer, thus facilitating an increase in layer data storage capacity of the present media, so that the overall data storage capacity of the media may also be increased. The data storage media will also advantageously be substantially stable in ambient light, so that exposure to the same does not result in substantial deterioration or damage to the media.

The nonlinear sensitizers used in the present optical data storage media are capable of transferring energy from an upper triplet state ($T_n$, wherein n>1), which has a very short lifetime (nanoseconds to a few micro seconds), to the reactant. The ability to transfer energy from the $T_n$ state provides the optical storage media provided herein with its nonlinear, threshold properties. That is, $T_n$ excited state absorption is only appreciable when the sensitizer is excited by high-intensity light, for example light having an intensity at least 2 orders of magnitude or more greater than ambient light, and negligibly small when subjected to low-energy radiation. This allows for the present optical data storage media, comprising the nonlinear sensitizers, to remain substantially transparent and inert to low intensity radiation, for example, reading or ambient light, and to only change its properties (absorbance and thus, refractive index) in response to high energy recording light at or near the focal points. As a result, the present optical data storage media exhibits the threshold behavior desired and/or necessary for the bit-wise recordation of microholographic data.

As mentioned above FIG. 4 is a schematic energy level diagram 400 showing the upper triplet $T_n$ excited state absorption and resulting energy transfer for a sensitizer exhibiting reverse saturable absorption. As shown in energy level diagram 400, arrow 410 illustrates the ground state absorption cross section of a photon as it transitions from the singlet ground state $S_0$ to a first excited state $S_1$. The intersystem-crossing rate, represented by arrow 412, signifies the transfer of energy that occurs when the sensitizer moves from an excited singlet state $S_1$ to a corresponding triplet state $T_1$. Arrow 414 indicates the excited triplet state absorption cross section. Once the upper level triplet state $T_n$ is achieved by subsequent linear absorption, two upper excited decay processes are possible. One possible decay process, denoted by arrow 416 in FIG. 4, is the non-radiative relaxation by internal conversion (IC) to the lower lying $T_1$ state. The other possible decay process is denoted by arrow 418 in FIG. 4, and involves the release of energy from the sensitizer and the transfer of this energy to the reactant via triplet-triplet energy transfer. The reactant then undergoes a change denoted by arrow 420 to form the holographic grating and record the data. The change in this case is a chemical reaction, and more particularly, a bimolecular photochemical process involving a cinnamate molecule electronically excited to its triplet state undergoes addition with a unexcited or a ground state cinnamate molecule to form a cyclobutane ring structure.

In some embodiments, the present nonlinear sensitizers may absorb two photons, typically, sequentially. Also, once the sensitizers described herein transfer the absorbed energy to the reactant (as shown at 418, FIG. 4), they return to their original state, and may repeat the process many times over. The sensitizers thus do not get substantially consumed over time, although their ability to absorb energy and release it to one or more reactants may degrade over time. This is in contrast to materials known conventionally as photosensitive materials, which can absorb energy (typically a single photon) and not transfer it to other molecules, but undergo conversion to a new structure, or react with another molecule to form a new compound in so doing.

In one embodiment, the nonlinear sensitizers comprise reverse saturable absorbers (RSAs). For the purposes of this application, a reverse saturable absorber (RSA) is a compound that has extremely low linear absorption at a given wavelength (such as 532 or 405 nanometers) and transmits nearly all of the light. However, when subjected to high intensity laser power at these given wavelengths, low level linear absorption can lead to a state where the molecule has a higher absorption cross section and becomes highly absorbing at that same wavelength; causing it to strongly absorb subsequent photons. This nonlinear absorption is often referred to as sequential two-photon absorption. Examples of RSAs suitable for use in the present optical data storage media are disclosed in Perry et al., "Enhanced reverse saturable absorption and optical limiting in heavy atom-substituted phthalocyanines", Optics Letters, May 1, 1994, Vol. 19, No. 9, pages 625-627, hereby incorporated by reference herein in its entirety.

Many RSAs experience photoexcitation when impinged upon by incident actinic radiation having a wavelength of 532 nanometers. Because this wavelength is within the green color portion of the visible spectrum, these RSA's may typically be referred to as "green" RSA's. Any of these green RSA's that are capable of entering into the upper triplet ($T_2$) state upon photoexcitation may be utilized in the present optical data storage media. Examples of green RSAs include metal/ligand complexes, such as phthalocyanines, naphthalocyanines or porphyrins; fullerenes; or transition metal cluster compounds, including transition metals, group IIA-VIA metals, and/or rare earth metals. In some embodiments, phthalocyanines and porphyrins, and in particular those comprising indium, lead, copper or zinc, may be used. Suitable examples phthalocyanines that can be employed include, but are not limited to lead(II)tetrakis(4-cumylphenoxy)phthalocyanine, copper(II)tetrakis(4-cumylphenoxy)phthalocyanine, zinc 2,9,16,23-tetra-tert-butyl-29H, 31H-phthalocyanine or indium 2,9,16,23-tetra-tert-butyl-29H-31H-phthalocyanine.

Lesser known are RSA's capable of undergoing photoexcitation upon impingement with incident actinic radiation at a wavelength of 405 nanometers, or "blue" RSA's. Several new RSA's have been recently discovered and are disclosed in U.S. patent application Ser. Nos. 12/551,410, and 12/551,455, respectively, filed concurrently herewith, and incorporated herein by reference in their entirety for any and all purposes, so long as not directly contradictory with the teachings herein. Generally speaking, these new blue RSA's include subphthalocyanines, and platinum ethynyl based dyes, specific examples of which include, but are not limited to, 3,5-dibromophenoxysubphthalocyaninato]-boron(III), 3-iodophenoxysubphthalocyaninato]boron(III), trans-Bis (tributylphosphine)-bis(4-ethynylbiphenyl)platinum (PPE), trans-Bis(tributylphosphine)bis(4-ethynyl-1-(2-phenylethynyl)benzene)platinum (PE2).

The reverse saturable absorbing molecules listed herein are exemplary, and many more varieties of reverse saturable absorbing molecules, or other molecules exhibiting non-linear absorption, may be used in the optical data storage media disclosed herein.

The amount of nonlinear sensitizer used in the optical data storage media may depend on its optical density at the wavelength of light used to record the hologram. Solubility of the sensitizer may also be a factor. In one embodiment, the sensitizer may be used in an amount of from about 0.002 weight percent to about 15 weight percent, based upon the total weight of the data storage media. In another embodiment, the sensitizer may be used in an amount of from about 0.01 weight percent to about 4.5 weight percent. In yet another embodiment, the sensitizer may be used in an amount of from about 1 weight percent to about 5 weight percent.

In certain embodiments, photostabilizers may also be included in the optical data storage media described herein. Typically, the photo stabilizers assist in the photostabilization of the non-linear sensitizer utilized herein. Those of ordinary skill in the art are aware of compounds/materials useful for this purpose, and useful amounts of these, and any of these may be used, in any suitable amount. In one exemplary embodiment, the compound that may assist in the photostabilization of a phthalocyanine dye, for example, includes bisdithiobenzil nickel.

Optionally, the data storage media may further comprise a mediator to assist in upper triplet energy transfer from the sensitizer to the reactant. The triplet state ($T_{1m}$) of the mediator will desirably be (a) below the triplet state ($T_n$; n>1) of the sensitizer but above the $T_1$ of the sensitizer and (b) above the triplet state ($T_{1r}$) of the reactant, or ideally between about 50 kilocalories per mole to about 90 kilocalories per mole.

In certain embodiments, where the mediator is employed, presence of mediator in the samples may help in improving the sensitivitiy at write intensities. One of the factors that may limit the sensitivity in energy-transfer systems is a larger energy difference between the $T_2$ state of the RSA dye (3-Iodophenoxysubphthalocyaninato]boron(III) (3IphOSubPc), about 110) and the $T_1$ state (about 58 kilocalories per mole) of the acceptor (cinnamate) molecule about 58 kilocalories per mole. The triptlet-triplet-energy-transfer (TTET) is typically found to be more efficient only when the Donor-Acceptor energy difference is less than about 20 kilocalories per mole. In order to overcome this limitation, we use a mediator—a molecule that does not absorb light directly, but participate in the energy transfer by receiving the energy from the RSA dye molecules and transferring it further to the index change material molecules with the efficiency that is higher than that of the direct transfer from the sensitizer to the acceptor. The mediator is chosen such that its triplet energy ($T_1$) is below the $T_2$ state of the RSA dye but above the acceptor $T_1$ state. Being a nonlinear function of the donor-acceptor energy difference, the resulting efficiency of two sequential energy transfer processes (donor→mediator→acceptor) may be more efficient than a director donor→acceptor transfer.

Examples of suitable mediators include, but are not limited to, acetophenone ($T_1 \approx 78$ kilocalories per mole), dimethylphthalate ($T_1 \approx 73$ kilocalories per mole), propiophenone ($T_1 \approx 72.8$ kilocalories per mole), isobutyrophenone ($T_1 \approx 71.9$ kilocalories per mole), cyclopropylphenylketone ($T_1 \approx 71.7$ kilocalories per mole), deoxybenzoin ($T_1 \approx 71.7$ kilocalories per mole), carbazole ($T_1 \approx 69.76$ kilocalories per mole), diphenyleneoxide ($T_1 \approx 69.76$ kilocalories per mole), dibenzothiophene ($T_1 \approx 69.5$ kilocalories per mole), 2-dibenzoylbenzene ($T_1 \approx 68.57$ kilocalories per mole), benzophenone ($T_1 \approx 68$ kilocalories per mole), polyvinylbenzophenone ($T_1 \approx 68$ kilocalories per mole), 1,4-diacetylbenzene ($T_1 \approx 67.38$ kilocalories per mole), 9H-fluorene ($T_1 \approx 67$ kilocalories per mole), triacetylbenzene ($T_1 \approx 65.7$ kilocalories per mole), thioxanthone ($T_1 \approx 65.2$ kilocalories per mole), biphenyl ($T_1 \approx 65$ kilocalories per mole), phenanthrene ($T_1 \approx 62$ kilocalories per mole), phenanthrene ($T_1 \approx 61.9$ kilocalories per mole), flavone ($T_1 \approx 61.9$ kilocalories per mole), 1-napthonirile ($T_1 \approx 57.2$ kilocalories per mole), poly (β-naphthoylstyrene) ($T_1 \approx 55.7$ kilocalories per mole), Fluorenone ($T_1 \approx 55$ kilocalories per mole), and combinations thereof.

If utilized, the mediator may, if desired, be covalently attached to, or otherwise associated with, the polymer matrix. Incorporating the mediator into the polymer matrix in this way can allow for higher concentrations of the mediator to be utilized, which, in turn, can increase recording efficiency of the data storage media.

The amount of mediator used, if any, should not be so much as to cause self-quenching, i.e., when two triplets of the mediator meet each other to generate a singlet state and a ground state of the mediator. Optimal amounts of any mediator may also depend on the particular sensitizer. In one embodiment, if the mediator is dispersed within the polymer matrix the mediator may be present in an amount in a range from about 1 weight percent to about 20 weight percent in the polymer matrix. In another embodiment, the mediator may be present in an amount in a range from about 1.5 weight percent to about 10 weight percent in the polymer matrix. In yet another embodiment, the mediator may be present in an amount in a range from about 2 weight percent to about 8 weight percent in the polymer matrix. In one embodiment, if the mediator is covalently attached to the polymer matrix the mediator may be present in an amount in a range from about 2 weight percent to about 50 weight percent in the polymer matrix. within the polymer matrix. In another embodiment, the mediator may be present in an amount in a range from about 5 weight percent to about 40 weight percent in the polymer matrix. In yet another embodiment, the mediator may be present in an amount in a range from about 4 weight percent to about 30 weight percent in the polymer matrix.

The desired sensitizer and reactant may be substantially uniformly dispersed through a polymer matrix, or may be dispersed in any fashion so that bit-wise data recordation is facilitated within the medium. The polymer matrix may comprise a linear, branched or cross-linked polymer or co-polymer. Any polymer may be used so long as the sensitizer and reactant can be substantially uniformly dispersed therein. Further, any polymer utilized will desirably not substantially interfere with the upper triplet energy transfer process. The polymer matrix may desirably comprise a polymer that is optically transparent, or at least has a high transparency at the wavelength contemplated for recording and reading the optical data storage medium.

Particular examples of suitable polymers for use in the polymer matrix include, but are not limited to, poly(alkyl methacrylates), such as poly(methyl methacrylate) (PMMA), polyvinyl alcohols, poly(alkyl acrylates), polystyrenes, polycarbonates, polyacrylates, poly(vinylidene chloride), poly (vinyl acetate), and the like. As mentioned above, the sensitizer may also be covalently attached, or otherwise associated with, the polymer matrix. For example, polymers such as polyesters, polycarbonates and polyacrylates including stilbene are readily available, or, are readily functionalized to include stilbene units.

The polymer matrix may also contain a plasticizer, such as dibutyl phthalate, dibutyl sebacate or di(2-ethylbexy) adipate. Plasticizers can enhance recording efficiencies by facilitating molecular motion. Typical plasticizer levels may be in a range from about 1 weight percent to about 20 weight percent, or from about or from about 2 weight percent to about 10 weight percent, based upon the total weight of the storage media.

The optical data storage media described herein may be in a self-supporting form. Or, the data storage media may be coated onto a support material, such as polymethyl(methacrylate) (PMMA), polycarbonate, poly(ethylene terephthalate), poly(ethylene naphthalate), polystyrene, or cellulose acetate Inorganic support materials such as glass, quartz or silicon may also be used, in those embodiments wherein use of a support material may be desired.

In such embodiments, the surface of the support material may be treated in order to improve the adhesion of the optical data storage media to the support. For example, the surface of the support material may be treated by corona discharge prior to applying the optical data storage media. Alternatively, an undercoating, such as a halogenated phenol or partially hydrolyzed vinyl chloride-vinyl acetate copolymer can be applied to the support material to increase the adhesion of the storage media thereto.

Generally speaking, the optical data storage media described herein can be prepared by blending the desired sensitizer, reactant, mediator (if desired) and polymer matrix. Proportions of these may vary over a wide range, and the optimum proportions and methods of blending may be readily determined by those of ordinary skill in the art. For example, the sensitizer may be present in concentrations of from about 0.01 weight percent to about 90 weight percent, and the reactant may be present in concentrations of from about 2 weight percent to about 80 weight percent, or even up to about 90 weight percent, based upon the total weight of the optical data storage media.

EXAMPLES

Starting materials were bought commercially or made from known methods. Cinnamoyl chloride, oxalyl chloride, p-methoxy cinnamic acid, p-chloro cinnamic acid, Boron subphthalocyanine chloride, dimethoxy benzene, iodine, 2- and 4-bromoresorcinol, 3,5-dibromorescorcinol, 3-iodophenol, 2-bromophenol, 4-bromophenol, 3,5-dibromophenol, 10 percent Pd/C (all Aldrich) were used as received.

Thin film samples for demonstrating microholograms and recording the reflectivity after writing microholograms were prepared as follows. The sensitivities at Read and Write intensities were determined based on quantum efficiency measurement studies.

Example 1-33 (E-1 to E-4) and Comparative Example 1-2 (CE-1 to CE-2)

Synthesis of boron subphthalocyanine 3-iodo-5-glutarylphenoxide-appended-with cinnamoyl chloride derivatives To 250 milliliters round bottom flask were added polyvinyl alcohol, 88 percent hydrolysed (1.4 grams, 0.0292 moles repeat unit) and 25 milliliters of N-methyl pyrrolidinone. The resultant mixture was heated to about 80 degrees Celsius under an atmosphere of nitrogen for about 2 hours. The heating resulted in the complete dissolution of polyvinyl alcohol. The resultant mixture was cooled to about 50 degrees Celsius. The cinnamoyl chloride derivatives were added in portions as a solid over a period of about two hours. In Example 3, where a mixture of 4-methoxy and 4-chloro cinnamoyl chloride derivatives were added, the cinnamoyl chloride derivatives were added as a 1:1 mixture of 4-methoxy and 4-chloro cinnamoyl chloride. After the addition of about 40 mole percent of the cinnamoyl chloride derivatives was completed, in each example, 2 milliliters of a corresponding weight percent solution of boron subphthalocyanine 3-iodo-5-glutarylphenoxide in methylene chloride acid chloride was added to the mixture. After the rest of cinnamoyl chloride was added the mixture was stirred for about one more hour at about 50 degrees Celsius. The resultant mixture was precipitated into a blender containing 75 milliliters of methanol. The resulting solid was collected by suction filtration then dissolved in 30 milliliters of methylene chloride and again precipitated into 75 milliliters of methanol. The resulting solid was dried in a vacuum oven at room temperature for 4 hours then overnight at 50 degrees Celsius. The quantities of various reactants added is included below in Table 1.

TABLE 1

| | Moles of cinnamoyl derivative | | | |
|---|---|---|---|---|
| Examples | 4-methoxy cinnamoyl chloride | 4-chloro cinnamoyl chloride | cinnamoyl chloride | Dye appended (moles) |
| E-1 | 0.43 | 0 | 0 | 0.0003 |
| E-2 | 0.43 | 0 | 0 | 0.00045 |
| E-3 | 0.215 | 0.215 | 0 | 0.00045 |
| CE-1 | 0 | 0 | 0.43 | 0.00034 |
| CE-2 | 0 | 0 | 0.43 | 0.00017 |

Example 4-7 (E-4 to E-7) and Comparative Example 3-5 (CE-3 to CE-5)

Preparation of Polymer Film from Phthalocyanine/Polyvinyl Cinnamates Prepared in Examples 1-3, and Comparative Example 1-2

2.2 weight percent solutions of boron subphthalocyanine 3-iodo-5-glutarylphenoxide polyvinyl cinnamoyl derivative prepared in E-1, E-2, and E-3 and CE-1 and CE-2, in tetrachloroethane were prepared independently. Benzophenone was added to each of these solutions. For each solution: The contents were dissolved by heating the solution on a hot plate at about 70 degrees Celsius. The solution was filtered through a 0.45 micrometer Whatman filter. The filtered solution was poured onto a 50 millimeters×25 millimeters microscopic slide and the solution was spin casted on a spin coater at about 2000 revolutions per minute for 30 seconds. Then the slide was dried for about 20 minutes to about 30 minutes in an oven at a temperature of about 70 degrees Celsius. The thickness of the polymer film formed was approximately about 100 nanometers. The amount of boron subphthalocyanine 3-iodo-5-glutarylphenoxide polyvinyl cinnamoyl derivative and benzophenone mediator added is included in Table 2 below.

TABLE 2

| Example | Polymer-Dye prepared in Example | Weight percent of dye appended | Weight percent of benzophenone | Sensitivity @write intensity 264 megawatt per square centimeter | Sensitivity at read intensity | Delta N at 405 nanometer | Index change conversion (percentage) |
|---|---|---|---|---|---|---|---|
| E-4 | E-1 | 3.6 | 4 | $1.66 \times 10^{-4}$ | $1.5 \times 10^{-5}$ | 0.18 | $6.06 \times 10^{-2}$ |
| E-5 | E-2 | 1.7 | 4 | $1.83 \times 10^{-4}$ | $9.00 \times 10^{-6}$ | 0.18 | $6.7 \times 10^{-2}$ |
| E-6 | E-2 | 1.7 | 8 | $1.44 \times 10^{-4}$ | $1.2 \times 10^{-5}$ | 0.18 | $5.3 \times 10^{-2}$ |
| E-7 | E-3 | 2.2 | 4 | $1.43 \times 10^{-4}$ | $1.3 \times 10^{-5}$ | — | $3.8 \times 10^{-2}$ |
| CE-3 | CE-1 | 4 | 4 | $4.15 \times 10^{-5}$ | $2.00 \times 10^{-6}$ | 0.08 | $1.09 \times 10^{-2}$ |
| CE-4 | CE-2 | 2 | 0 | $2.56 \times 10^{-5}$ | $2.00 \times 10^{-6}$ | 0.08 | $6.75 \times 10^{-3}$ |
| CE-5 | CE-2 | 2 | 4 | $3.00 \times 10^{-5}$ | $3.00 \times 10^{-6}$ | 0.08 | $8 \times 10^{-5}$ |

Examples 4, 5, 6, and 7, and CE-4 and CE-5 utilize sensitizers functional at approximately 405 nanometers, therefore the performance was evaluated using the 405 nanometers apparatus. It is further expected that optical data storage media according to examples 7, 8, 9, and 10 exhibit refractive index change capacity of at least about 0.1. Additionally, the use of benzophenone as a mediator whose triplet energy ($T_1$) is 74 kcal/mol has been used to improve the sensitivities due to better energy transfer efficiency from the RSAdye-Mediator-PVCm. For example comparison of CE-3 and CE-4 (in the absence and presence of benzophenone respectively) improvement in sensitivites at the write intensities are observed. Since the mediators receive the triplet energy from the RSA dyes, the sensitizers are chosen in such a way that they do not directly absorb 405 nanometers light.

Figure 5:
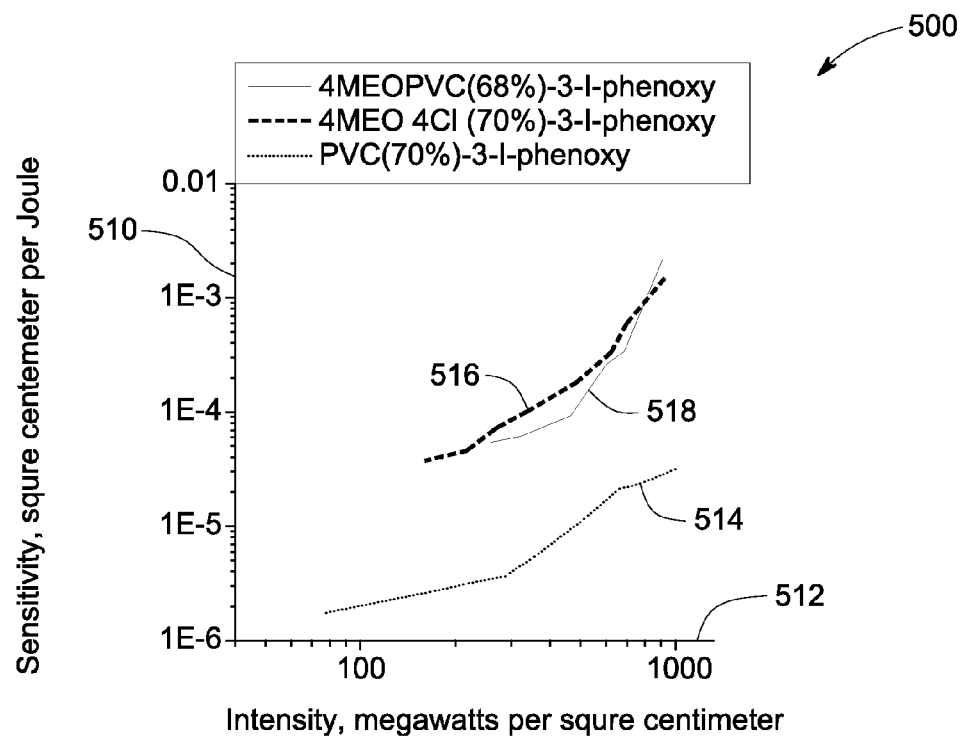
FIG. 5 is a graphical depiction of sensitivity as a function of intensity for different holographic media in accordance with an embodiment of this invention.

FIG. 5 is a graphical depiction 500 of sensitivity as a function of intensity obtained from quantum efficiency measurements for three different holographic media. The graph 500 shows sensitivity in square centimeters per joule on the Y-axis 510 versus intensity in megawatts per square centimeter on the X-axis 512. Curve 514 refers to sensitivity obtained for film prepared in CE-3, curve 516 refers to sensitivity obtained for film prepared in E-7, and curve 518 refers to sensitivity obtained for film prepared in E-4. As seen from the values for sensitivity provided in Table 2 and in the graph, sensitivity of films prepared in E-4 and E-7 are higher than the sensitivity of film prepared in CE-3 at an intensity of about 200 megawatt per centimeter square.

Figure 6:
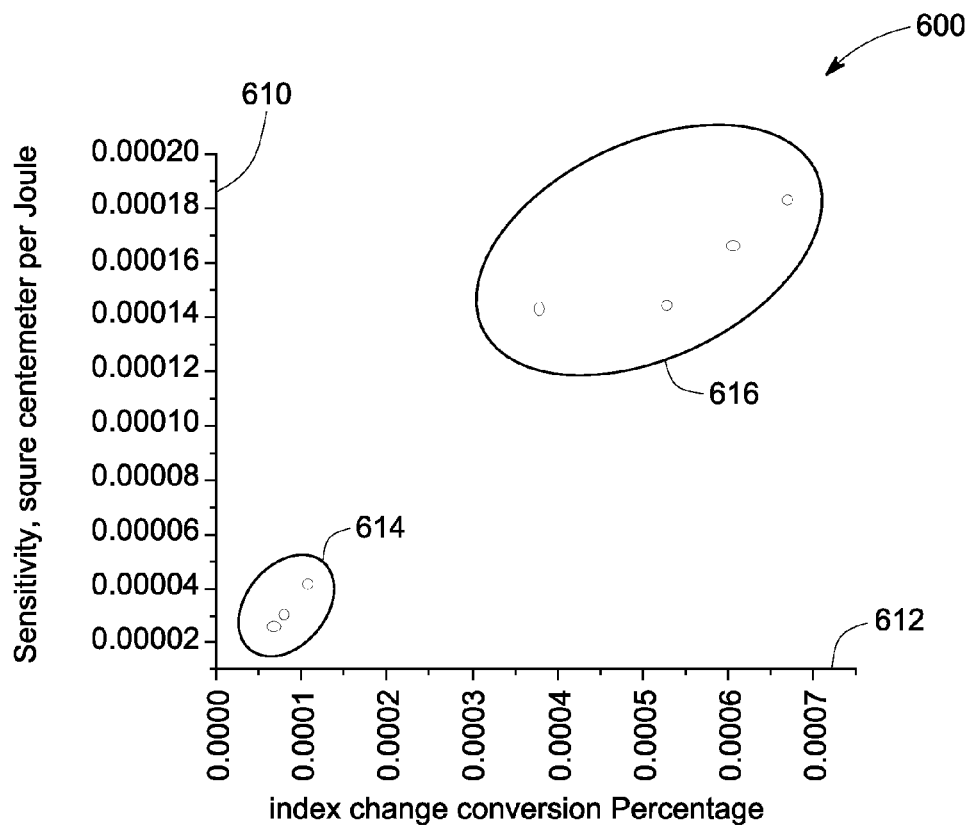
FIG. 6 is a graphical depiction of sensitivity as a function of index change conversion for different holographic media in accordance with an embodiment of this invention.

FIG. 6 is a graphical depiction 600 of sensitivity as a function of index change conversion obtained from quantum efficiency measurements in accordance with an embodiment of this invention. The graph 600 shows sensitivity in square centimeters per joule on the Y-axis 610 versus index change conversion on the X-axis 512. Cloud 614 refers to sensitivity obtained for films prepared in CE-3, CE-4, and CE-5. Cloud 616 refers to sensitivity obtained for films prepared in E-4, E-5, E-6, and E-7. As shown in the FIG. 6 and in Table 2, sensitivity is greater for films prepared in E-4 to E-7 when compared with films prepared in CE-3 to CE-5. The index change conversion is also at least 6 times greater at intensity 264 megawatt per centimeter square as shown in the graph 600 and values provided in Table 2 for films prepared in E-4 to E-7 when compared with films prepared in CE-3 to CE-5.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An optical data storage medium comprising:
   a polymer matrix;
   a reactant capable of undergoing a change upon triplet excitation, thereby causing a refractive index change; and
   a non-linear sensitizer capable of absorbing actinic radiation to cause upper triplet energy transfer to said reactant;
   wherein the refractive index change capacity of the medium is at least about 0.1; and
   wherein the reactant comprises polyvinyl chlorocinnamate, polyvinyl methoxycinnamate, or a combination thereof.

2. The optical data storage medium of claim 1, wherein the reactant comprises polyvinyl 4-chlorocinnamate, polyvinyl 3-chlorocinnamate, polyvinyl 2-chlorocinnamate, polyvinyl 4-methoxycinnamate, polyvinyl 3-methoxycinnamate, polyvinyl 2-methoxycinnamate, or a combination thereof.

3. The optical data storage medium of claim 1, wherein the medium is capable of storing microholographic data.

4. The optical data storage medium of claim 1, further comprising a mediator capable of transferring energy between the non-linear sensitizer and the reactant.

5. The optical data storage medium of claim 4, wherein the mediator comprises acetophenone, dimethylphthalate, benzophenone, 9H-fluorene, biphenyl, phenanthrene, 1-napthonitrile, or combinations thereof.

6. The optical data storage medium of claim 4, wherein the mediator is benzophenone.

7. The optical data storage medium of claim 1, wherein the non-linear sensitizer comprises a sequential two-photon absorption process by a reverse saturable absorber.

8. The optical data storage medium of claim 1, wherein the non-linear sensitizer comprises a phthalocyanine dye, a subphthalocyanine dye, or an alkynyl platinum dye.

9. The optical data storage medium of claim 1, further comprising a photostabilizer.

10. The optical data storage medium of claim 9, wherein the photostabilizer comprises bisdithiobenzil nickel.

11. The optical data storage medium of claim 1, wherein the polymer matrix comprises polyvinylalcohol, poly(alkyl methacrylates), poly(alkyl acrylates), polystyrenes, polycarbonates, polyacrylates, poly(vinylidene chloride), poly(vinyl acetate), or combinations thereof.

12. The optical data storage medium of claim 1, wherein the reactant and non-linear sensitizer are distributed substantially homogenously throughout the polymer matrix.

13. A method for optical data storage comprising:
   providing an optical data storage medium comprising a polymer matrix, a reactant capable of undergoing a change upon triplet excitation, thereby causing a refractive index change and a non-linear sensitizer capable of absorbing actinic radiation to cause upper triplet energy transfer to said reactant, wherein the refractive index change capacity of the medium is at least about 0.1; and
recording a microhologram in said optical data storage medium;
wherein the reactant comprises a cinnamate derivative selected from polyvinyl chlorocinnamate, polyvinyl methoxycinnamate, or a combination thereof.

14. The method of claim 13, wherein the reactant comprises polyvinyl 4-chlorocinnamate, polyvinyl 3-chlorocinnamate, polyvinyl 2-chlorocinnamate, polyvinyl 4-methoxycinnamate, polyvinyl 3-methoxycinnamate, polyvinyl 2-methoxycinnamate, or a combination thereof.

15. The method of claim 13, wherein the optical data storage medium further comprises a mediator capable of transferring energy between the non-linear sensitizer and the reactant.

16. The method of claim 13, wherein the mediator comprises acetophenone, dimethylphthalate, benzophenone, 9H-fluorene, biphenyl, phenanthrene, 1-napthonitrile, or combinations thereof.

17. The method of claim 13, wherein the non-linear sensitizer comprises a sequential two-photon absorption process by a reverse saturable absorber.

18. The method of claim 13, wherein the non-linear sensitizer comprises a phthalocyanine dye, a subphthalocyanine dye, or an alkynyl platinum dye.

19. The method of claim 13, wherein the optical data storage medium further comprises a photostabilizer.

20. The method of claim 13, wherein the polymer matrix comprises polyvinylalcohol, poly(alkyl methacrylates), poly(alkyl acrylates), polystyrenes, polycarbonates, polyacrylates, poly(vinylidene chloride), poly(vinyl acetate), or combinations thereof.

* * * * *